(12) United States Patent
Goetz et al.

(10) Patent No.: US 6,657,300 B2
(45) Date of Patent: Dec. 2, 2003

(54) FORMATION OF OHMIC CONTACTS IN III-NITRIDE LIGHT EMITTING DEVICES

(75) Inventors: Werner K. Goetz, Palo Alto, CA (US); Michael D. Camras, Sunnyvale, CA (US); Changhua Chen, deceased, late of San Jose, CA (US), by Xiaoping Chen, legal representative; Gina L. Christenson, Sunnyvale, CA (US); R. Scott Kern, San Jose, CA (US); Chihping Kuo, Milpitas, CA (US); Paul Scott Martin, Pleasanton, CA (US); Daniel A. Steigerwald, Cupertino, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 52 days.

(21) Appl. No.: 09/755,935

(22) Filed: Jan. 5, 2001

(65) Prior Publication Data
US 2002/0008243 A1 Jan. 24, 2002

Related U.S. Application Data

(63) Continuation-in-part of application No. 09/092,065, filed on Jun. 5, 1998, now abandoned.

(51) Int. Cl.[7] ............................................. H01L 23/48
(52) U.S. Cl. ...................... 257/745; 257/94; 257/103
(58) Field of Search ............................. 257/744, 745, 257/94, 96, 97, 102, 103

(56) References Cited

U.S. PATENT DOCUMENTS

| | | | |
|---|---|---|---|
| 5,644,165 A | * 7/1997 | Goto | 257/744 |
| 5,747,832 A | 5/1998 | Nakamura et al. | 257/103 |
| 5,753,939 A | 5/1998 | Sassa et al. | 257/103 |
| 5,804,839 A | 9/1998 | Hanaoka et al. | 257/123 |
| 5,987,047 A | 11/1999 | Valster et al. | 372/45 |
| 5,998,810 A | * 12/1999 | Hatano et al. | 257/102 |
| 6,005,258 A | 12/1999 | Manabe et al. | 257/13 |
| 6,100,586 A | * 8/2000 | Chen et al. | 257/45 |
| 6,121,127 A | * 9/2000 | Shibata et al. | 438/604 |
| 6,239,490 B1 | * 5/2001 | Yamada et al. | 257/745 |
| 6,531,716 B2 | * 3/2003 | Udagawa | 257/94 |
| 6,537,838 B2 | * 3/2003 | Stockman | 438/22 |

FOREIGN PATENT DOCUMENTS

| | | |
|---|---|---|
| EP | 1 014 455 A1 | 2/0000 |
| EP | 0 703 631 A1 | 3/1996 |
| EP | 1 017 113 A1 | 7/2000 |
| EP | 1 041 650 A2 | 10/2000 |
| EP | 1079444 A2 | 2/2001 |
| JP | 08330629 A | 12/1996 |
| JP | 10093194 | 4/1998 |
| JP | 10-173231 | 6/1998 |
| WO | WO 00/59046 | 10/2000 |

* cited by examiner

Primary Examiner—Sara Crane
(74) Attorney, Agent, or Firm—Patent Law Group LLP; Rachel V. Leiterman

(57) ABSTRACT

P-type layers of a GaN based light-emitting device are optimized for formation of Ohmic contact with metal. In a first embodiment, a p-type GaN transition layer with a resistivity greater than or equal to about 7 Ωcm is formed between a p-type conductivity layer and a metal contact. In a second embodiment, the p-type transition layer is any III-V semiconductor. In a third embodiment, the p-type transition layer is a superlattice. In a fourth embodiment, a single p-type layer of varying composition and varying concentration of dopant is formed.

9 Claims, 6 Drawing Sheets

US 6,657,300 B2

FORMATION OF OHMIC CONTACTS IN III-NITRIDE LIGHT EMITTING DEVICES

This is a continuation-in-part of application Ser. No. 09/092,065, filed Jun. 5, 1998 ABN.

FIELD OF THE INVENTION

The present invention is related to the manufacture of III-V light emitting and laser diodes, particularly towards improving the characteristics of the electrical contact to the p-type portion of the diode.

BACKGROUND

Gallium nitride (GaN) compounds have wavelength emissions in the entire visible spectrum as well as part of the UV. FIG. 1 illustrates a typical GaN-based light emitting diode (LED). Currently, most GaN-based LEDs are epitaxially grown on a sapphire or silicon carbide (SiC) substrate. A double hetero-structure that includes a nucleation layer, n-type layer, active region, p-type AlGaN layer, and a p-type layer of GaN is formed on the substrate. In general, the ability to fabricate ohmic contacts to the p-type layer is desirable for the realization of reliable light emitting diodes and laser diodes. Ohmic contacts to p-type GaN are difficult to achieve because the attainable hole concentration is limited for Mg-doped III-nitride based semiconductors. In addition, many light-emitting diodes and vertical cavity surface-emitting laser diodes use thin, transparent metal contacts. The choice of metals is limited and metal layers need to be thin, e.g. <15 nm, to reduce light absorption. Because there is poor lateral current spreading in p-type GaN, the metal layers typically cover nearly the entire device area.

P-type conductivity for GaN is achieved by doping with Mg, which substitutes for gallium in the GaN lattice and acts as an acceptor ($Mg_{Ga}$). $Mg_{Ga}$ introduces a relatively deep acceptor level into the band gap of GaN. As a consequence, only ~1% of the incorporated Mg acceptors are ionized at room temperature. To illustrate, a Mg concentration ([Mg]) of ~5e19 $cm^{-3}$ is needed to achieve a room temperature hole concentration of ~5e17 $cm^{-3}$. Further, Mg-doped GaN requires a post-growth activation process to activate the p-type dopants. The post-growth activation process may be, for example, thermal annealing, low-energy electron-beam irradiation, or microwave exposure. For conductivity-optimized Mg-doped GaN layers, [Mg]<5e19 $cm^{-3}$, the acceptor concentration ($N_A$) is about equal to the atomic Mg concentration and the resistivity can be around 1 Ωcm or less. These layers may be referred to as "p-type conductive layers". Increasing the Mg content beyond approximately 5e19 $cm^{-3}$ does not translate to higher acceptor concentration. Typically, a reduction of $N_A$ is observed when the [Mg] exceeds a certain maximum concentration and the layer becomes resistive.

SUMMARY

P-type layers of a III-nitride-based light-emitting device are optimized for formation of an Ohmic contact with metals. In some embodiments, a p-type transition layer is formed between a p-type conductivity layer and the metal contact. The p-type transition layer may be a GaN layer with a resisitivity greater than 7 ohm-centimeters, a III-nitride layer, a III-nitride layer with added As or P, or a superlattice with alternating highly doped or elemental dopant sublayers and lightly doped or undoped sublayers.

In some embodiments, the p-type layer is continuous with varying levels of dopant. The concentration of dopant in the region of the p-type layer adjacent to the p-contact is greater than the concentration of dopant in the region of the p-type layer adjacent to the active region. The p-type layer may also have a varying composition, for example of Al or In or both.

DETAILED DESCRIPTION

Figure 1:
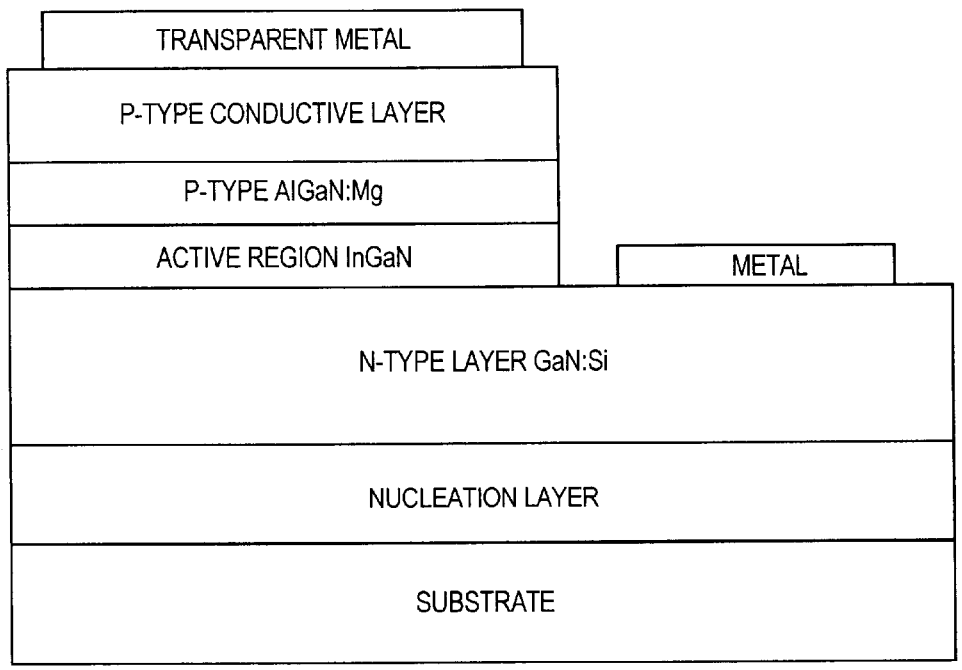
FIG. 1 illustrates a prior art light-emitting diode.
Figure 2:
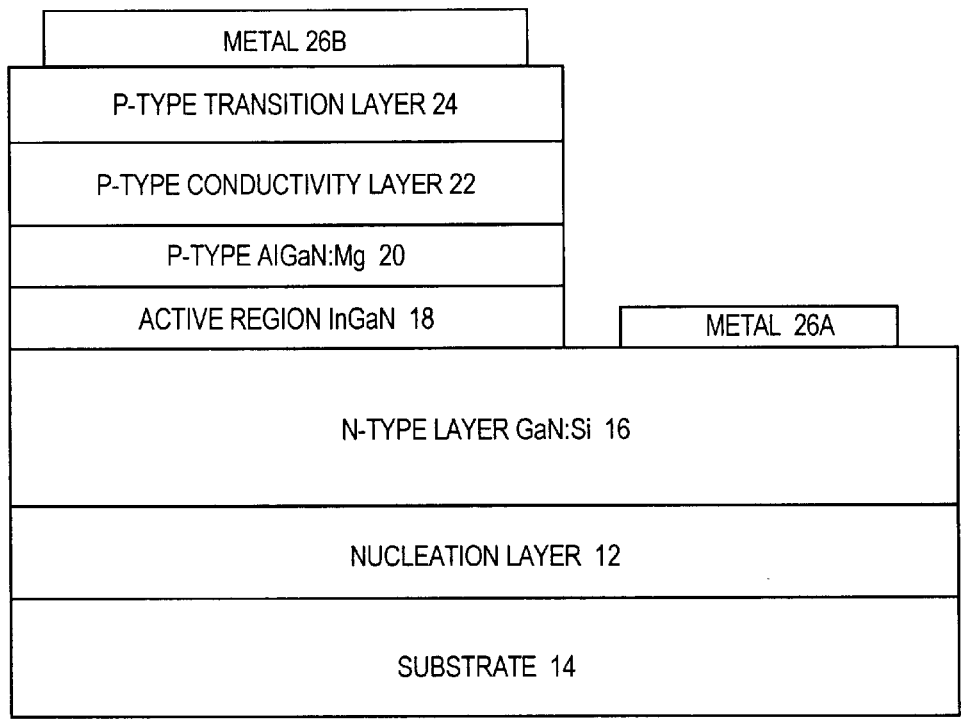
FIG. 2 illustrates a light-emitting diode according to a first embodiment of the present invention.

FIG. 2 schematically illustrates a GaN light-emitting diode 10 according to a first embodiment of the present invention. A nucleation layer 12 is grown over a substrate 14, for example $Al_2O_3$, SiC, or GaN. An n-type layer 16 of GaN that is doped with Si is fabricated over the nucleation layer 12. An active region 18 of InGaN is fabricated over the n-type layer 16. A p-type layer 20 of AlGaN:Mg is fabricated over the active region 18, followed by a p-type layer 22 of Mg-doped GaN that has been optimized for conductivity (p-type conductivity layer), followed by a p-type transition layer 24 deposited over the p-type layer 22. Metal contacts 26A and 26B are applied to the n-type layer 16 and the p-type transition layer 24, respectively. The metal contacts may be transparent or opaque.

Figure 3:
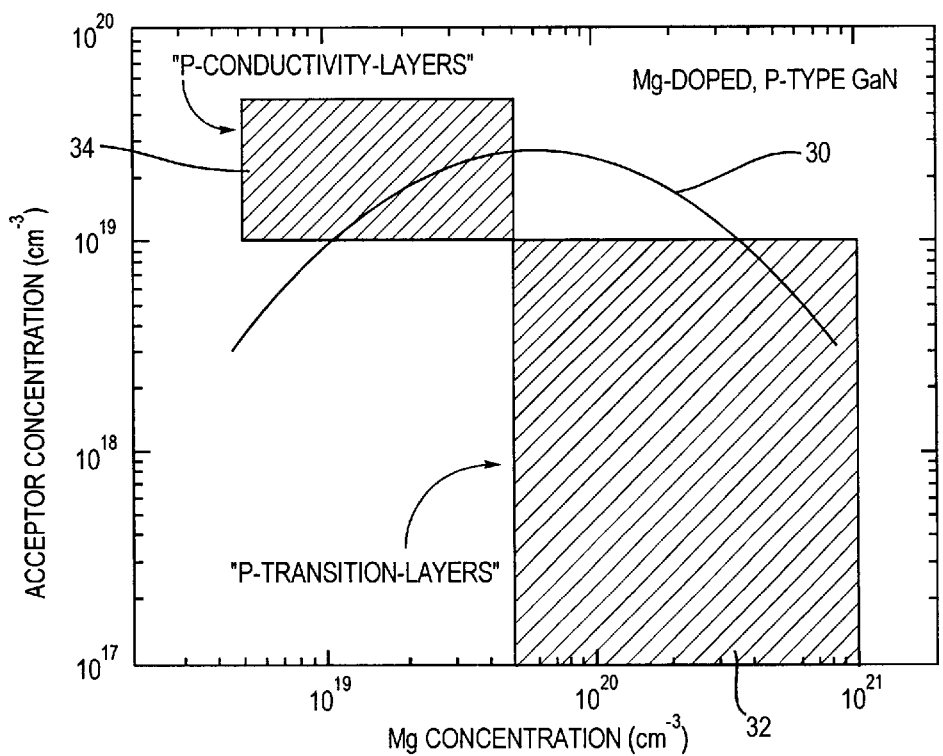
FIG. 3 illustrates $N_A$ plotted as a function of [Mg].

P-type transition layer 24 is optimized to form a good Ohmic contact with the metal layer. In the first embodiment, the material of p-type transition layer 24 is a GaN-based layer that contains a higher atomic Mg but a lower acceptor/hole concentration when compared to the p-type conductivity layer 22. In FIG. 3, the dependence of $N_A$ is illustrated as a function of [Mg]. Curve 30 illustrates Mg concentrations and resulting acceptor concentrations for a specific set of growth conditions. Other growth conditions may cause the curve to shift up or down or left or right, but the shape of the curve is expected to be approximately the same as curve 30 regardless of the growth conditions. As illustrated by curve 30, when a GaN-based film is highly doped with Mg, the acceptor concentration decreases, thus the film becomes highly resistive. This behavior is atypical of other III-V semiconductors.

Exemplary Mg and acceptor concentrations for p-type conductivity layers are shown in region 34. Typically, p-type conductivity layer 22 has a [Mg] less than approximately $5e19$ cm$^{-3}$, $N_A \sim$[Mg], and resistivities of about 1 $\Omega$cm or less. In contrast, p-type transition layer 24 is a highly resistive film having a [Mg]>about $5e19$ cm$^{-3}$, and $N_A \ll$ [Mg]. The high Mg doping may be achieved by adjusting the growth conditions to promote the Mg incorporation into the solid phase, for example by increasing the Mg/Ga ratio in the gas phase. The Mg and acceptor concentrations for embodiments of p-type transition layer 24 are shown in region 32. Region 32 of FIG. 3 illustrates an approximate range of Mg and acceptor concentrations. In some embodiments, the Mg and acceptor concentrations of p-type transition layer 24 may be outside of region 32. Transition layer 24 forms an Ohmic contact with metals, e.g. transparent or non-transparent contacts of Au, Ni, Al, Pt, Co, Ag, Ti, Pd, Rh, Ru, Re, and W, or alloys thereof.

The p-type dopants for p-type transition layer 24 are selected from the Group II family which includes Be, Mg, Ca, Sr, Zn, and Cd. A preferred dopant is Mg, which may be co-doped with a Group VIA element, such as O, S, Se, and Te.

Figures 4A, 4B:
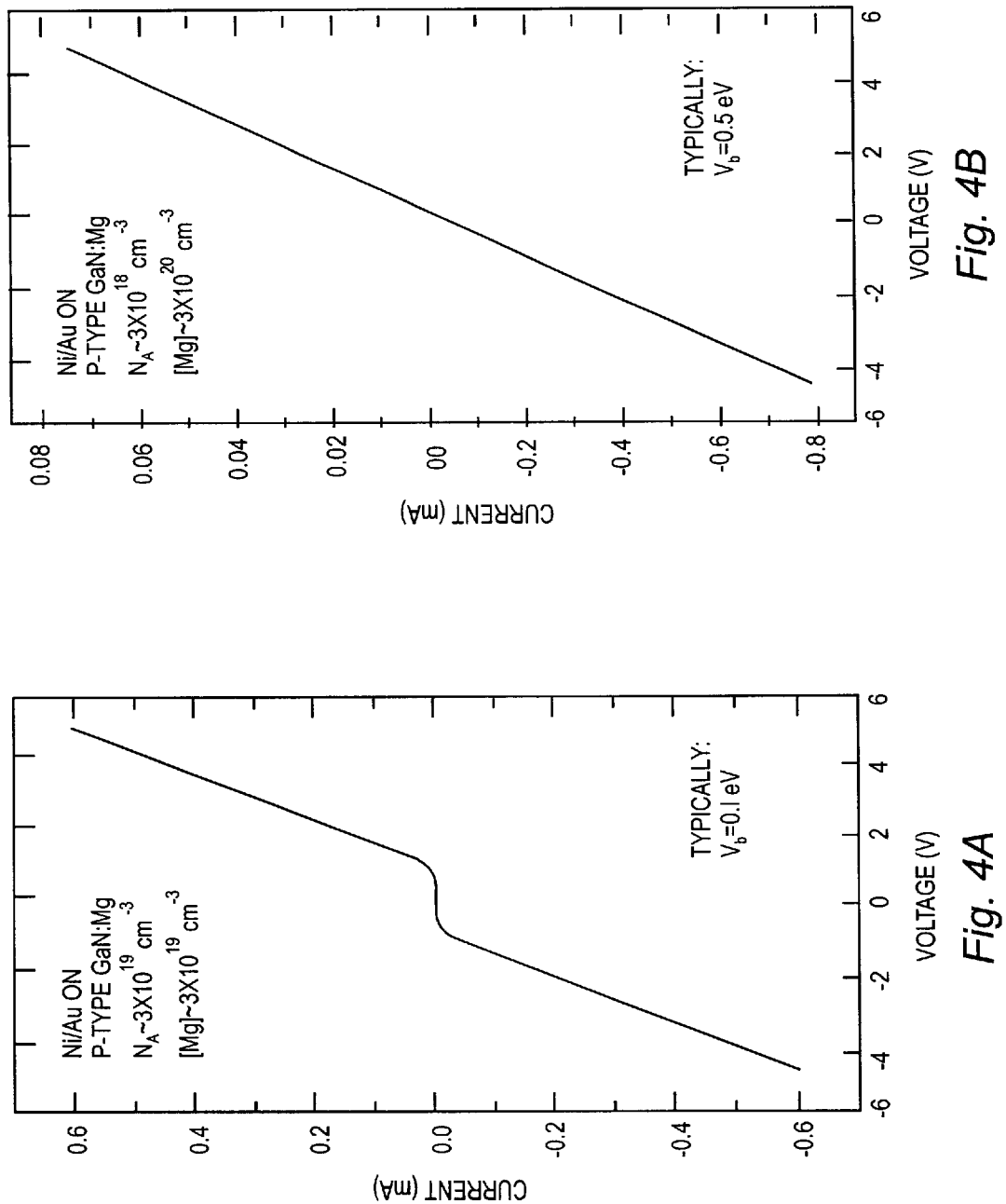
FIGS. 4A and 4B demonstrate the I-V characteristics for a Ni/Au—Mg-doped GaN contact in "back-to-back" configuration for the metals deposited on a p-type conductive layer (A) and on a p-type transition (B) layer.

In one example of the first embodiment, the thickness of p-type transition layer 24 ranges between about 10 and about 200 nm. As a consequence, the contribution of p-type transition layer 24 to the series resistance is small. FIG. 4B demonstrates the I-V characteristics for a Ni/Au metal p-type GaN contact in "back-to-back" (metal-semiconductor-semiconductor-metal) configuration for a Mg-doped GaN layer optimized for Ohmic contact formation (p-type transition layer according to the first embodiment). The forward current (I) exhibits a linear dependence on the voltage (V) indicating that the contact is Ohmic. FIG. 4A demonstrates the situation for a p-type conductivity layer. The I-V curve indicates the presence of a barrier to current flow.

Figure 5A:
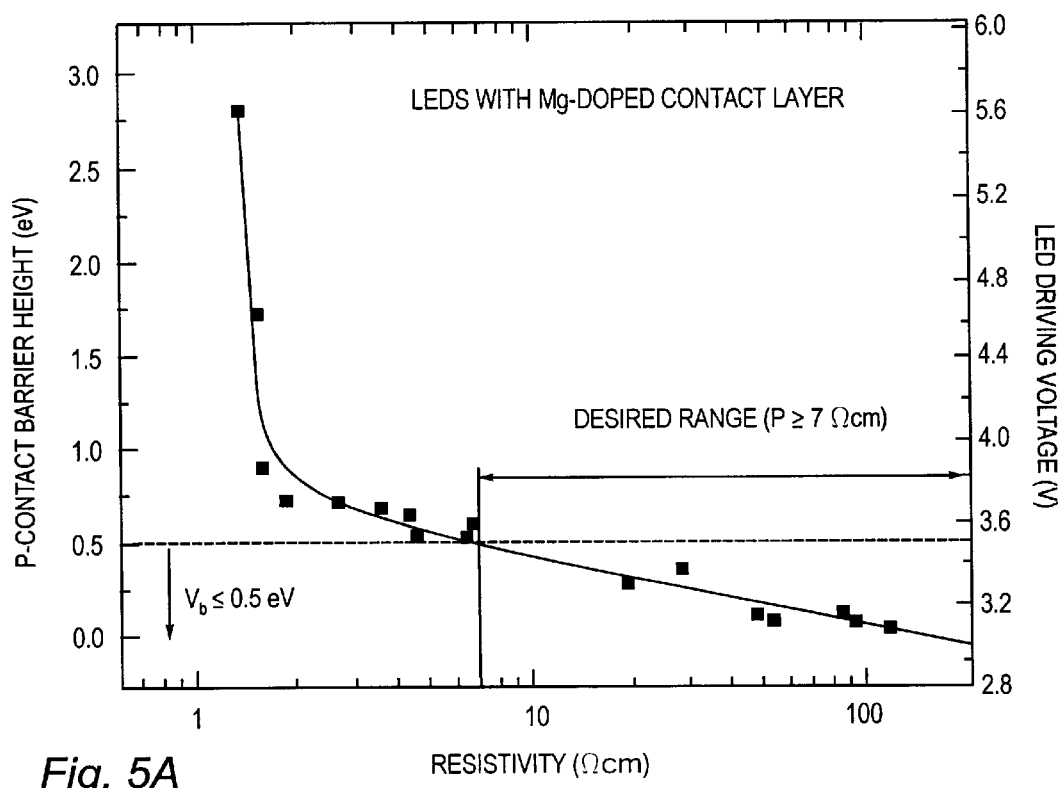
FIG. 5A demonstrates the relationship between p-contact barrier height and resistivity for Mg-doped GaN layers.

The p-type transition layer forms a contact with the metal layer that exhibits a barrier height < about 0.5 eV and almost Ohmic characteristics. If the contact is formed by depositing the metal directly on the p-type conductivity layer the barrier height is > about 1.0 eV. Utilization of contacts with such high barrier height would increase the forward voltage of the diodes and reduce their total power efficiency. In FIG. 5A, the barrier height is illustrated as a function of bulk resistivity of the transition material. Mg-doped GaN layers that have a low resistivity exhibit a high barrier height when combined with a metal layer to form a contact. As illustrated in FIG. 5A, a preferred embodiment of the p-type transition layer, that is, an embodiment with a barrier height less than about 0.5 eV, exhibits a bulk resistivity between about 7 $\Omega$cm and about 250 $\Omega$cm. Such p-type transition layers have the smallest impact on the driving voltage of the device. The driving voltage of such devices is less than or equal to about 3.5 volts. In other embodiments, the bulk resistivity may be greater than 250 $\Omega$cm. The differences in barrier heights of the p-type transition and conductivity layer may be explained by differences in the out-diffusion of Mg, redistribution of hydrogen near the surface of the Mg-doped GaN films, different properties of the surface, or formation of magnesium nitride inclusions in the highly Mg-doped transition layer.

Figure 5B:
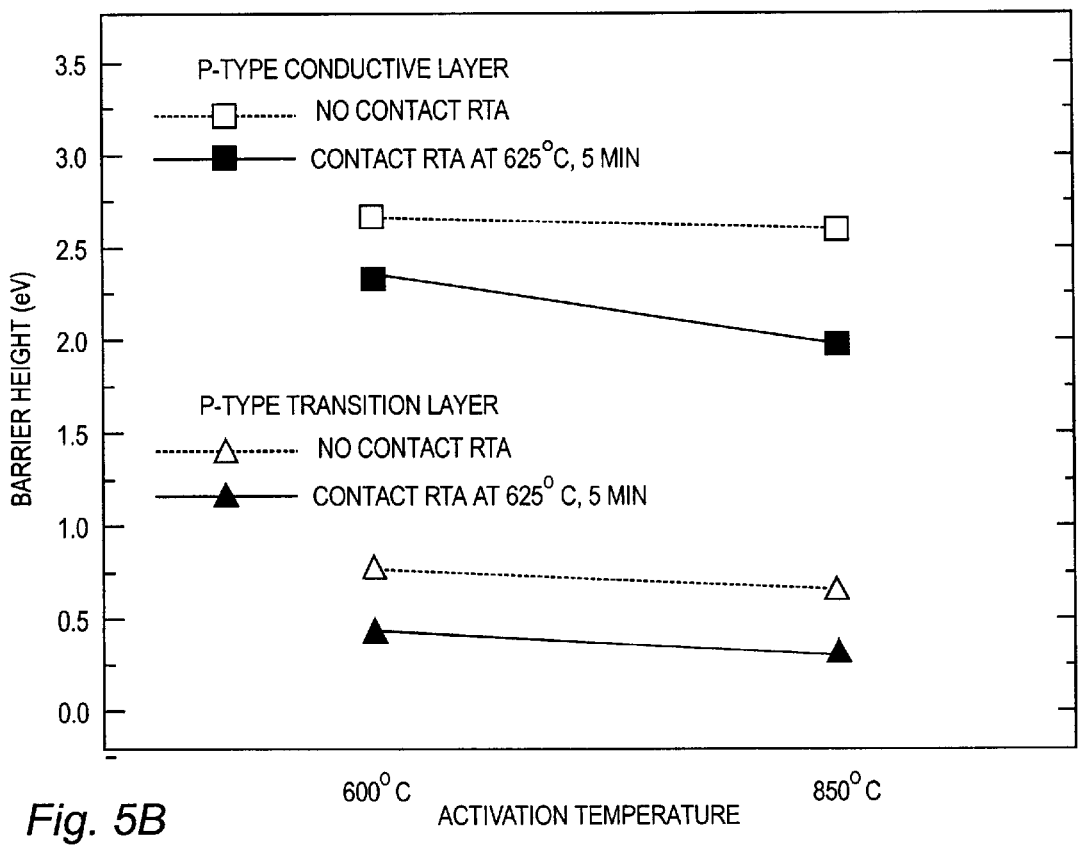
FIG. 5B demonstrates the effect of contact annealing on the Ni/Au—Mg-doped GaN contact barrier for p-type conductive and for p-type transition layers where the p-type conductivity was activated by two different RTA (5 min) activation processes (600° C. and 850° C.).

The barrier height may be further lowered through contact annealing. FIG. 5B demonstrates the effect of contact annealing in a RTA system on the barrier height of contacts formed with p-type conductivity layers and contacts formed with p-type transition layers. The y-axis shows the barrier height, and the x-axis shows the temperature of a thermal anneal to activate the p-type dopant in either type of layer. FIG. 5B thus illustrates the effect of two different anneals, a thermal acceptor-activation anneal and a contact anneal, called "contact RTA" on FIG. 5B.

Contact annealing reduces the barrier heights for both the transition layer and the p-type conductivity layer. For example, the barrier height for a p-type conductivity layer thermally annealed at 600° C. drops from about 2.7 eV before the contact anneal to about 2.3 eV after the contact anneal, and the barrier height for a p-type transition layer thermally annealed at 600° C. drops from about 0.8 eV before the contact anneal to about 0.4 eV after the contact anneal. However, even after contact annealing, contacts formed with p-type conductivity layers exhibit significantly higher barrier heights than contacts formed with p-type transition layers, e.g. about 2.3 eV for a p-type conductivity layer compared to about 0.4 eV for a p-type transition layer. Thus, though contact annealing does reduce the barrier height for a p-type conductivity layer contact, the effect is not enough to reduce the barrier height to that of a p-type transition layer contact.

The results shown in FIG. 5B also show that the observed barrier height reductions are not strongly dependent on the temperature of the acceptor activation process, working equally well for activation at 600° C. and 850° C. The method to reduce the barrier height by contact annealing is described by Nakamura et al., Appl. Phys. Lett. 70, 1417 (1997) "Room-temperature continuous-wave operation of InGaN multi-quantum-well structure laser diodes with a lifetime of 27 hours".

In a second embodiment, p-type transition layer 24 is not limited to Mg doped GaN, but is any III-V material. P-type transition layer 24 according to the second embodiment is homogeneously doped. P-type transition layer 24 according to the second embodiment may be, for example, InN, InGaN, AlInGaN, AlN, or AlGaN. When p-type transition layer 24 is InGaN, typically the group III compounds in the crystal are less than about 40% In, but the amount of In can range from 0–100% of the group III compound. When p-type transition layer 24 is AlGaN, typically the group III compounds in the crystal are less than about 20% Al, but the amount of Al can range from 0–100% of the group III compound.

Figure 6:
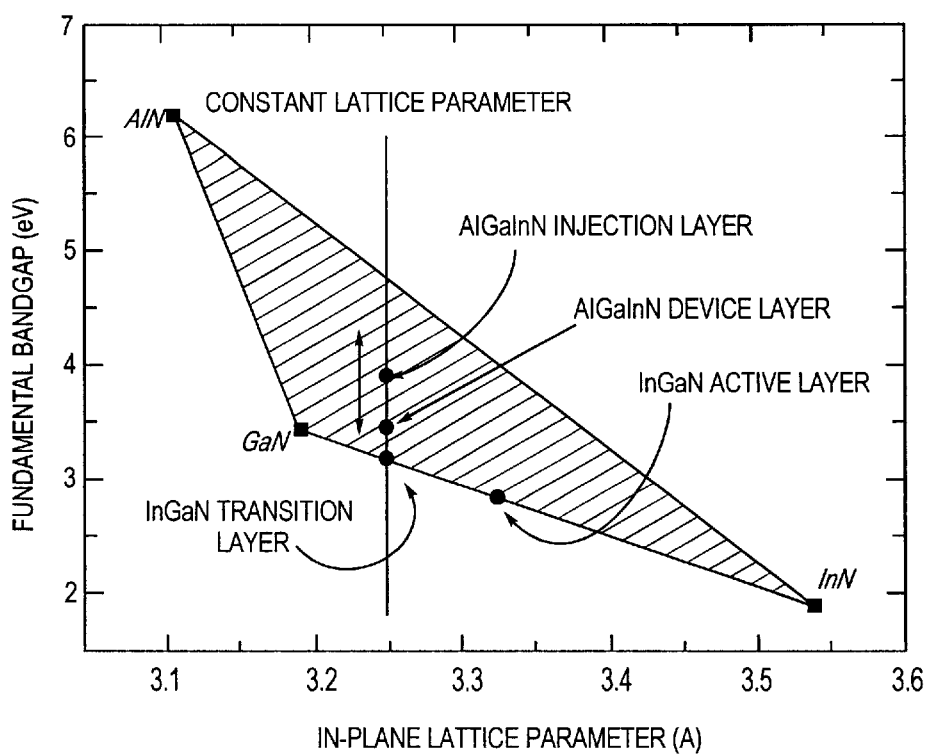
FIG. 6 demonstrates the relationship between bandgap energy and lattice parameter for the AlInGaN material system.

FIG. 6 illustrates the relationship between band gap and lattice parameter for compositions of aluminum, indium, and gallium in the quaternary AlInGaN material system. In FIG. 6, the squares represent the binary compounds AlN, GaN, and InN, the lines connecting the squares represent the ternary compounds AlGaN, AlInN, and InGaN with varying compositions of each group III material, and the shaded triangle between the lines represents the quaternary compound AlInGaN with varying compositions of each group III material. Line 60 represents an example lattice constant. The dots represent the composition of potential LED device layers. The injection layer refers to p-type conductivity layer 22. The simplest devices to fabricate have reasonably close lattice constants for each of the device layers. Thus, FIG. 6 illustrates that once the compositions of device layers have been selected, the composition of the p-type transition layer may be selected to lattice-match the p-type transition layer to the device layers, and to optimize the p-type transition layer for Ohmic contact.

P-type transition layer 24 according to the second embodiment may also be any III-nitride arsenide compound, III-nitride phosphide compound, or III-nitride arsenide phosphide compound, such as GaNAs, GaNP, or GaNAsP. The addition of even a small amount of As or P can significantly lower the bandgap of III-nitride semiconductors.

In the first and second embodiments of the invention, the p-type layers of the device are homogeneously doped. In the third and fourth embodiments, described below, at least one of the p-type layers of the device has a varying concentration of dopant.

Figure 7:
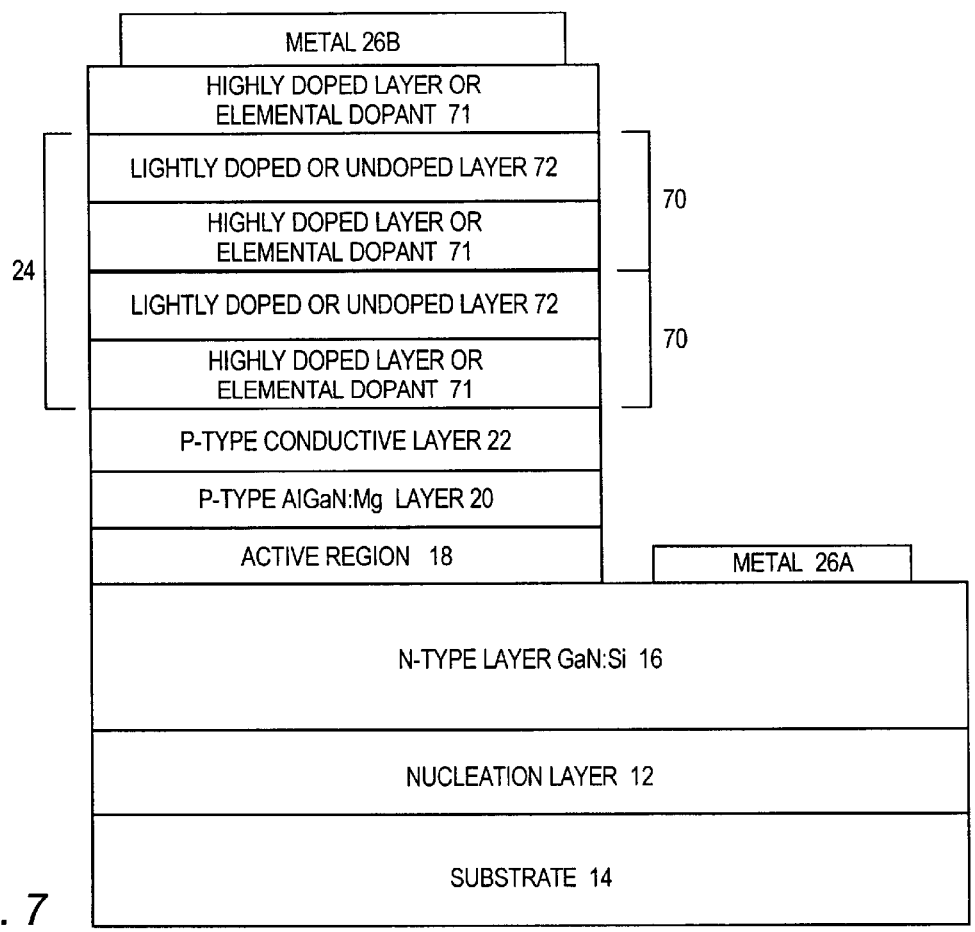
FIG. 7 illustrates a light-emitting diode according to a third embodiment of the present invention.

FIG. 7 illustrates a third embodiment of the invention where transition layer 24 (FIG. 2) is a doping superlattice. In many III-V semiconductors, a doping superlattice can achieve higher levels of doping than homogeneously doped layers. This is because in many III-V semiconductors, a heavily p-doped thick device layer exhibits poor surface quality. Accordingly, heavily doped layers and lightly doped or undoped layers are alternated in order to form a heavily doped structure with improved surface characteristics.

In a first example of the third embodiment, transition layer 24 consists of sets 70 of alternating highly doped and lightly doped or undoped layers. Each set of layers 70 has a layer 71 of highly Mg-doped material on the bottom and a layer 72 of undoped or lightly Mg-doped material on the top. The designations "bottom" and "top" are arbitrary, such that either type of sublayer may be adjacent to both the p-type conductive layer and the metal layer. Sublayers 71 and 72 range in thickness from 1 nm to 20 nm. In one example of the third embodiment, each of sublayers 71 and 72 is about 10 nm thick and transition layer 24 includes 10 sets of sublayers such that transition layer 24 is 200 nm thick. Highly doped layer 71 has a Mg concentration ranging from about 1e20 cm$^{-3}$ to about 5e21 cm$^{-3}$. Lightly doped layer 72 has a Mg concentration ranging from undoped to about 1e20 cm$^{-3}$.

In a second example of the third embodiment, rather than a heavily doped layer, layer 71 is a layer of elemental dopant. Thus, in this example, layer 72 may be Mg-doped or undoped GaN or AlInGaN and layer 71 may be elemental Mg.

Figure 8:
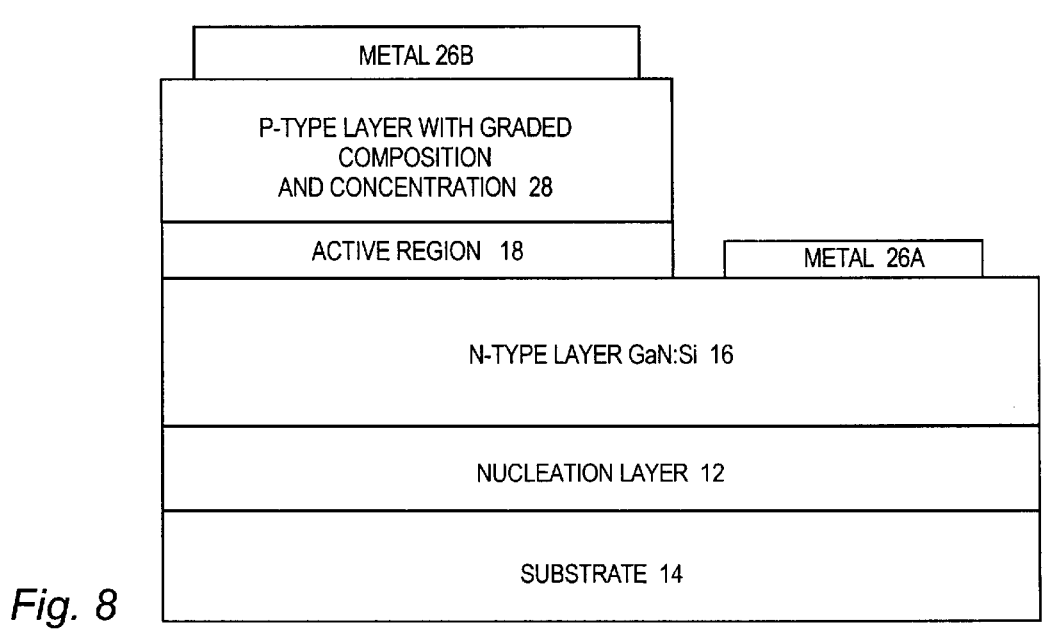
FIG. 8 illustrates a light-emitting diode according to a fourth embodiment of the present invention.

FIG. 8 illustrates a fourth embodiment of the invention. A p-type layer 28 separates active InGaN region 18 and metal layer 26B. P-type layer 28 is between 5 nm and 200 nm thick. P-type layer 28 is doped to provide for Ohmic contact formation with metal layer 26B and hole injection into active region 18. The composition and concentration are varied through layer 28. The variable doping in p-type layer 28 eliminates the need for a separate p-type conductivity layer.

Figure 9:
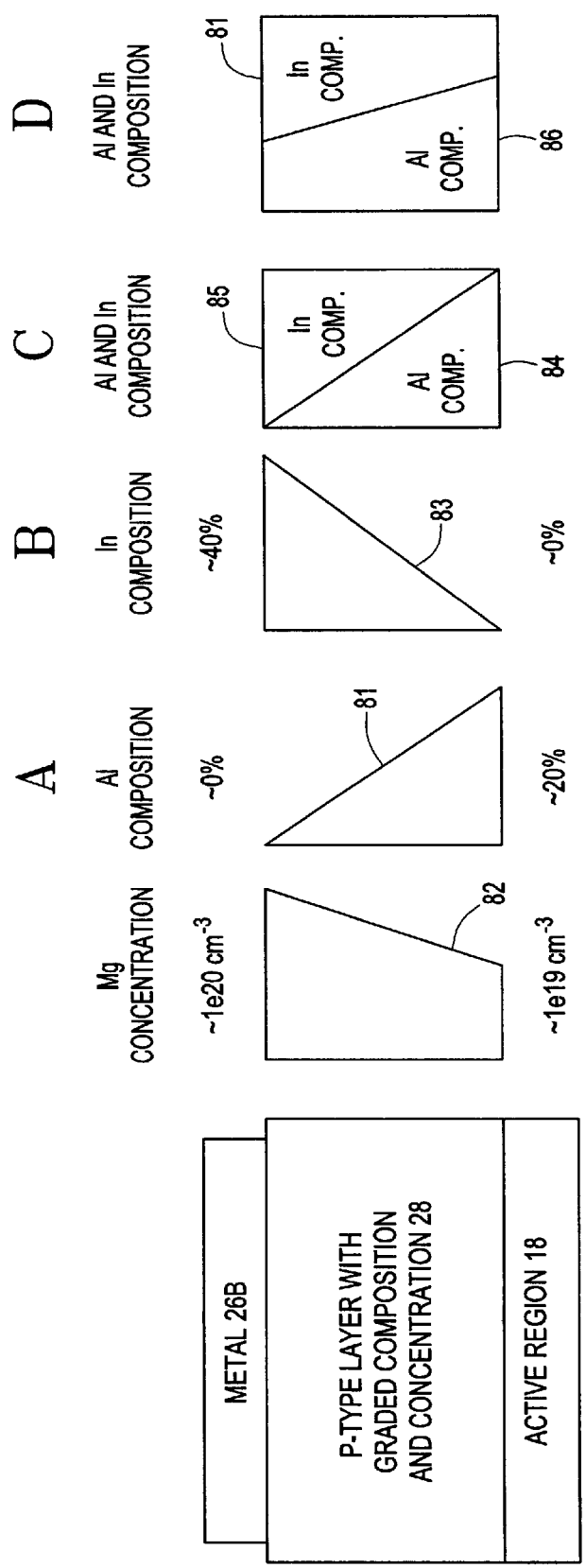
FIG. 9 illustrates the variation of Al and In composition and Mg concentration across the p-type layer of several examples of one embodiment of the light-emitting diode illustrated in FIG. 8.

FIG. 9 illustrates one example of varying Mg content and four examples, labeled A-D, of varying composition in p-type layer 28, according to the fourth embodiment. Curve 82 illustrates one example of the Mg concentration in layer 28. The amount of Mg in layer 28 increases from about 1e19 cm$^{-3}$ in the region adjacent to active region 18 to about 1e20 cm$^{-3}$ in the region adjacent to metal layer 26B. The concentration of Mg in the region of layer 28 adjacent to active region 18 may vary from about 1e18 cm$^{-3}$ to about 5e19 cm$^{-3}$. The concentration of Mg in the region of layer 28 adjacent to metal layer 26B may vary from about 5e19 cm$^{-3}$ to about 1e21 cm$^{-3}$. Curve 81 of example A illustrates a first example of varying composition where Al composition of layer 28 is varied. The amount of Al in layer 28 decreases from about 20% in the region adjacent to active region 18 to about 0% in the region adjacent to metal layer 26B. The presence of Al provides for efficient hole injection into the active layer, thus the Al composition is advantageously maximized in the region of layer 28 adjacent to active region 18. Curve 83 of example B illustrates an example where the In composition in layer 28 is varied. The amount of In increases from about zero percent in the region adjacent to active region 18 to about 40% in the region adjacent to metal layer 26B. The presence of In lowers the bandgap of the material and thereby provides for efficient Ohmic contact, thus the In composition is maximized near the metal contact. There may be no In present in the portion of the layer adjacent the active layer.

In examples C and D, both the Al and the In compositions are varied. In example C, as the composition of Al is reduced, the Al is replaced with In. As illustrated in curve 84, the composition of Al is zero near metal contact 26B. Similarly, as illustrated in curve 85, the composition of In is zero near active region 18. Thus, layer 28 varies from AlGaN immediately adjacent to the active region, to AlInGaN in the region between the active region and the metal contact, to InGaN immediately adjacent to the metal contact. In example D, both Al and In are present in all areas of layer 28. As illustrated by curve 86, the Al composition is reduced from the active region to the metal contact, but never reaches zero composition. Similarly, as illustrated by curve 87, the In composition is reduced from the metal contact to the active region, but never reaches zero composition. Layer 28 is thus entirely AlInGaN, but varies from more Al than In near the active region to more In than Al near the metal contact.

FIG. 9 illustrates just a few examples of the variation of composition and concentration in p-type layer 28 according to the fourth embodiment. In other examples, Al is present only in the half of p-type layer 28 adjacent to active region 18 and In is present only in the half of p-type layer 28 adjacent to metal contact 26B. In other examples, the composition of other group III or group V elements are varied. In still other examples, the concentration of a dopant other than Mg is varied. Further, As and P may be added to layer 28 to reduce the bandgap of layer 28, typically in the region of layer 28 that is adjacent to the contact. In order to form good contact, the lowest bandgap material is placed next to the metal contact. Since As and P reduce the bandgap of the material, As and P are added to the 1 to 2 nm of layer 28 adjacent to the contact in order to improve the characteristics of the contact. In devices which incorporate As or P into p-type layer 28, As or P may account for less than 3% of the of the group V materials.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, while the layer is illustrated as having been grown by MOCVD, it may also be fabricated by the techniques of MBE, HVPE, as well as evaporation, sputtering, diffusing, or wafer bonding.

We claim:

1. A light-emitting diode comprising:
   a substrate;
   an n-type layer of III-nitride formed over the substrate;
   an active region, formed over the n-type layer;
   a p-type $Al_xGa_{(1-x)}N$ ($0 \leq x \leq 1$) layer, formed over the active region;
   a p-type transition layer of GaN, formed over the p-type $Al_xGa_{(1-x)}N$ layer, the p-type transition layer having a resistivity of about 100 Ωcm; and an n-type contact and a p-type contact, the n-type contact being connected to the n-type layer, the p-type contact being connected to the p-type transition layer.

2. A light-emitting diode comprising:

a substrate;

an n-type layer of III-nitride formed over the substrate;

an active region, formed over the n-type layer;

a p-type $Al_xGa_{(1-x)}N$ ($0 \leq x < 1$) layer, formed over the active region;

a p-type transition layer, formed over the p-type $Al_xGa_{(1-x)}N$ layer, the p-type transition layer having a resistivity from about 7 Ωcm to about 250 Ωcm; and an n-type contact and a p-type contact, the n-type contact being connected to the n-type layer, the p-type contact being connected to the p-type transition layer.

3. The light emitting diode of claim 2 wherein the p-type transition layer further comprises at least one Group II dopant selected from Be, Mg, Ca, Sr, Zn, Cd, and C.

4. The light emitting diode of claim 3 wherein the Group II dopant is Mg and wherein the p-type transition layer further comprises a co-dopant selected from Si, Ge, O, S, Se, and Te.

5. The light emitting diode of claim 4 wherein the concentration of Mg exceeds about $5e10^{19}$ cm$^{-3}$ in the p-type transition layer.

6. The light emitting diode of claim 2 wherein the p-type transition layer is a III-V material.

7. The light emitting diode of claim 2 wherein the p-type transition layer is selected from GaN, AlInGaN, InGaN, GaNAs, GaNP, AlInGaNAsP, and GaNAsP.

8. The light emitting diode of claim 2 further comprising a p-type conductivity layer of GaN, formed over the p-type $Al_xGa_{(1-x)}N$ layer.

9. The light emitting diode of claim 2 wherein a driving voltage of the light emitting diode is less than about 3.5 volts.

* * * * *